US008877001B2

(12) United States Patent
Kitamura et al.

(10) Patent No.: US 8,877,001 B2
(45) Date of Patent: Nov. 4, 2014

(54) SHUTTERED GATE VALVE

(75) Inventors: Shin Kitamura, Chiba-ken (JP); Mitsutoshi Fukada, Tokyo (JP)

(73) Assignee: Applied Materials, Inc., Santa Clara, CA (US)

( * ) Notice: Subject to any disclaimer, the term of this patent is extended or adjusted under 35 U.S.C. 154(b) by 1365 days.

(21) Appl. No.: 12/437,150

(22) Filed: May 7, 2009

(65) Prior Publication Data

US 2010/0282710 A1 Nov. 11, 2010

(51) Int. Cl.
*F16K 3/02* (2006.01)
*F16K 3/30* (2006.01)
*H01L 21/02* (2006.01)
*H01L 21/3065* (2006.01)
*C23C 16/00* (2006.01)
*C23C 16/455* (2006.01)
*H01L 21/67* (2006.01)
*C23C 16/44* (2006.01)
*F16K 51/02* (2006.01)

(52) U.S. Cl.
CPC ...... *H01L 21/67126* (2013.01); *H01L 21/3065* (2013.01); *C23C 16/4412* (2013.01); *F16K 3/02* (2013.01); *F16K 51/02* (2013.01)
USPC ............ 156/345.29; 156/345.26; 156/345.27; 156/345.37; 156/345.48; 251/193; 251/302; 251/327; 118/715; 118/50; 118/50.1; 118/723 I; 216/58

(58) Field of Classification Search
CPC ..... F16K 51/02; F16K 3/02; H01L 21/67069; H01L 21/3065; H01L 21/67772; H01L 21/67126; C23C 16/4412
USPC ............ 118/715, 50, 50.1, 723 I; 156/345.26, 156/345.27, 345.29, 345.37, 345.48; 251/329, 193, 302, 327, 301, 326, 195; 216/58

See application file for complete search history.

(56) References Cited

U.S. PATENT DOCUMENTS 5,965,046 A * 10/1999 Franklin et al. ............... 219/201
6,206,971 B1 * 3/2001 Umotoy et al. ............... 118/715
6,274,854 B1 * 8/2001 Franklin et al. ............... 219/546

(Continued)

FOREIGN PATENT DOCUMENTS

CN 1082679 A 2/1994
KR 10-2005-0015191 A 2/2005

(Continued)

OTHER PUBLICATIONS

International Search Report and Written Opinion mailed Jan. 11, 2011 for PCT Application No. PCT/US2010/033341.

*Primary Examiner* — Jeffrie R Lund
(74) *Attorney, Agent, or Firm* — Moser Taboada; Alan Taboada

(57) ABSTRACT

Embodiments of gate valves and methods of using same are provided herein. In some embodiments, a gate valve for use in a process chamber may include a body having an opening disposed therethrough from a first surface to an opposing second surface of the body; a pocket extending into the body from a sidewall of the opening; a gate movably disposed within the pocket between a closed position that seals the opening and an open position that reveals the opening and disposes the gate completely within the pocket; and a shutter configured to selectively seal the pocket when the gate is disposed in the open position. In some embodiments, one or more heaters may be coupled to at least one of the body or the shutter.

24 Claims, 3 Drawing Sheets

(56) References Cited

U.S. PATENT DOCUMENTS

| | | | |
|---|---|---|---|
| 6,296,780 B1* | 10/2001 | Yan et al. | 216/67 |
| 6,364,954 B2* | 4/2002 | Umotoy et al. | 118/715 |
| 6,448,567 B1* | 9/2002 | Botelho et al. | 250/492.21 |
| 8,028,972 B2* | 10/2011 | Iijima | 251/302 |
| 8,137,462 B2* | 3/2012 | Fondurulia et al. | 118/715 |
| 8,448,917 B2* | 5/2013 | Nagai et al. | 251/193 |
| 2002/0053191 A1* | 5/2002 | Gu | 55/282 |
| 2004/0079915 A1* | 4/2004 | Contin et al. | 251/167 |
| 2005/0034465 A1* | 2/2005 | Borchers et al. | 62/55.5 |
| 2006/0042755 A1* | 3/2006 | Holmberg et al. | 156/345.1 |
| 2008/0085226 A1* | 4/2008 | Fondurulia et al. | 422/198 |
| 2008/0149031 A1* | 6/2008 | Chu et al. | 118/726 |
| 2010/0282710 A1* | 11/2010 | Kitamura et al. | 216/58 |
| 2010/0327203 A1* | 12/2010 | Nagai et al. | 251/193 |

FOREIGN PATENT DOCUMENTS

| | | | | |
|---|---|---|---|---|
| WO | WO 03-006854 A2 | 1/2003 | | |
| WO | WO 2007-142395 A1 | 12/2007 | | |
| WO | WO 2009057513 A1 * | 5/2009 | | F16K 51/02 |
| WO | WO 2010129452 A2 * | 11/2010 | | H01L 21/00 |
| WO | WO 2010129452 A3 * | 3/2011 | | |

* cited by examiner

SHUTTERED GATE VALVE

FIELD

Embodiments of the present invention generally relate to processing equipment.

BACKGROUND

Within processing equipment, a gate valve may be utilized, for example, to control pressure within a process chamber and/or to control the flow of reactive species, process gases, byproducts from a process, or the like from a processing volume. Gate valves typically include a gate disposed in a gate valve body and selectively movable between two positions—a closed position where the gate seals an opening in the gate valve and an open position where gases may flow through the opening in the gate valve. Unfortunately, however such gases can undesirably flow into a recess of the gate valve body where the gate is disposed when in the open position and may form deposits or corrode the gate (or other components of the gate valve). Such deposits can undesirably break free, for example, by a pressure change in the process chamber, by vibration due to operation of the gate valve, or the like, which can lead to undesirable contamination of a substrate being processed in the chamber.

Accordingly, there is a need in the art for an improved gate valve.

SUMMARY

Embodiments of gate valves and methods of using same are provided herein. In some embodiments, a gate valve for use in a process chamber may include a body having an opening disposed therethrough from a first surface to an opposing second surface of the body; a pocket extending into the body from a sidewall of the opening; a gate movably disposed within the pocket between a closed position that seals the opening and an open position that reveals the opening and disposes the gate completely within the pocket; and a shutter configured to selectively seal the pocket when the gate is in the open position. In some embodiments, one or more heaters may be coupled to at least one of the body or the shutter.

In some embodiments, an apparatus for processing a substrate may include a process chamber having an inner volume for holding a substrate therein during processing; and a gate valve coupled to the process chamber, wherein the gate valve includes a body having an opening disposed therethrough from a first surface to an opposing second surface of the body; a pocket extending into the body from a sidewall of the opening; a gate movably disposed within the pocket between a closed position that seals the opening and an open position that reveals the opening and disposes the gate completely within the pocket; and a shutter configured to selectively seal the pocket when the gate is in the open position.

In some embodiments, a method of removing an effluent from a process environment may include providing a process chamber having a gate valve coupled thereto for exhausting materials from an inner volume of the process chamber, the gate valve comprising a body having an opening disposed therethrough and a pocket extending into the body from a sidewall of the opening, a gate movably disposed in the pocket and the opening, wherein the gate is disposed within the pocket when the gate valve is in the open position, and a shutter that seals the pocket and gate from the opening when the gate valve is in the open position; performing a process in the process chamber that generates an effluent to be removed from the inner volume; and flowing the effluent from the inner volume through the opening with the gate valve in the open position to remove the contaminant from the process environment. In some embodiments, the method may further include heating the gate valve to prevent deposition of a contaminant on exposed portions of the gate valve. In some embodiments, the process comprises a plasma etch process that utilizes a plasma formed from a process gas. In some embodiments, the process gas comprises at least one of trifluoromethane ($CHF_3$) or chlorine ($Cl_2$). In some embodiments, the contaminant comprises at least one of a byproduct, a reactive species, or the process gas.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
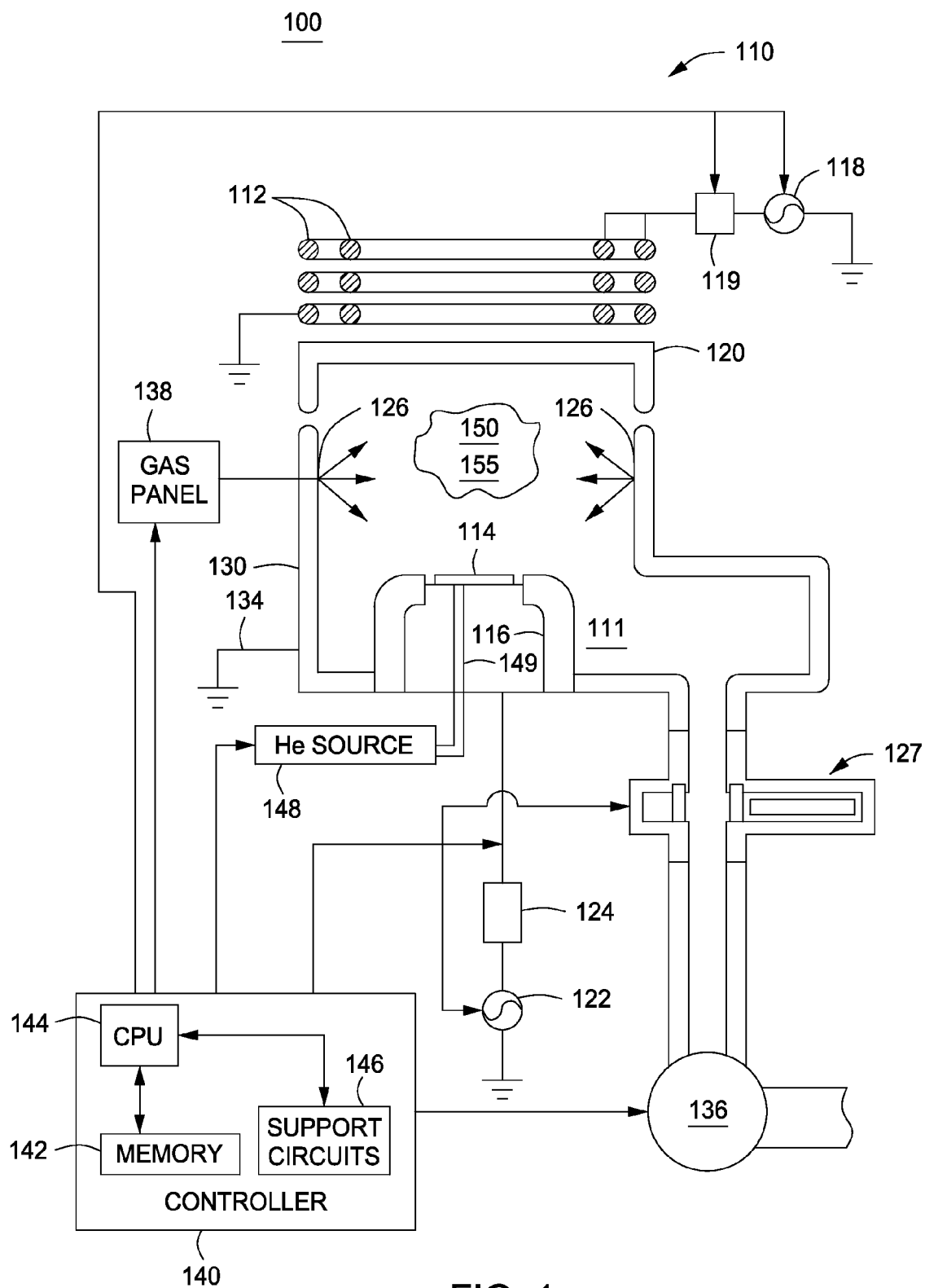
FIG. 1 depicts a schematic side view of an etch reactor having a gate valve coupled thereto in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of gate valves and methods for using same are provided herein. The inventive gate valves and methods of using same advantageously restrict or prevent process gases, byproducts, or other such species generated during processing from depositing within a pocket of the gate valve. The inventive method may advantageously prevent contaminants from re-entering the process environment upon exhaust therefrom due to deposition and subsequent flaking from gate valve components.

The inventive gate valve may be disposed in a process chamber, such as an etch reactor or other suitable process chambers that require a gate valve. For example, FIG. 1 depicts a schematic diagram of an illustrative etch reactor 100 of the kind that may be used to practice embodiments of the invention as discussed herein. The etch reactor 100 may be utilized alone or, more typically, as a processing module of an integrated semiconductor substrate processing system, or cluster tool, such as a CENTURA® integrated semiconductor substrate processing system, available from Applied Materials, Inc. of Santa Clara, Calif. Examples of suitable etch reactors 100 include the ADVANTEDGE™ line of etch reactors (such as the AdvantEdge G3 or the AdvantEdge G5), the DPS® line of etch reactors (such as the DPS®, DPS® II, DPS® AE, DPS® HT, DPS® G3 poly etcher), or other etch reactors, also available from Applied Materials, Inc. Other etch reactors and/or cluster tools may suitably be used as well, such as chambers with remote plasma sources, electron cyclotron resonance (ECR) plasma chambers, and the like. Other non-etch reactors that utilize gate valves and/or process gases that may form deposits may also be modified to advantage with the gate valve disclosed herein.

The illustrative etch reactor 100 comprises a chamber 110 having a substrate support (cathode) 116 within a conductive body (wall) 130, and a controller 140. The chamber 110 may have a vacuum pump 136, for example, such as a turbo pump or the like, fluidly coupled to an inner volume 111 of the chamber 110 via a gate valve 127. The chamber 110 may be supplied with a substantially flat dielectric ceiling 120. Alternatively, the chamber 110 may have other types of ceilings, e.g., a dome-shaped ceiling. An antenna comprising at least one inductive coil element 112 is disposed above the ceiling 120 (two co-axial inductive coil elements 112 are shown). The inductive coil element 112 is coupled to a plasma power source 118 through a first matching network 119. The plasma power source 118 typically is capable of producing, for example, up to 3000 W at a tunable frequency in a range from 50 kHz to 13.56 MHz.

The substrate support 116 is coupled, through a second matching network 124, to a biasing power source 122. The biasing power source 122 generally is capable of producing up to 1500 W at a frequency of, for example, approximately 13.56 MHz. The biasing power may be either continuous or pulsed power. In other embodiments, the biasing power source 122 may be a DC or pulsed DC source.

A controller 140 comprises a central processing unit (CPU) 144, a memory 142, and support circuits 146 for the CPU 144 and facilitates control of the components of the chamber 110 and, as such, any etch process performed therein.

In operation, a substrate 114 is placed on the substrate support 116 and process gases are supplied from a gas panel 138 through entry ports 126 and form a gaseous mixture 150. The gaseous mixture 150 is ignited into a plasma 155 in the chamber 110 by applying power from the plasma power source 118 and biasing power source 122 to the inductive coil element 112 and the cathode 116, respectively. The gaseous mixture 150 and/or plasma 155 may interact with the substrate 114, for example, in a plasma etch process to remove a portion of the substrate material. The substrate material may be removed, for example, by reacting with the plasma 155 to form a gaseous byproduct which can be exhausted from the chamber 110 via the gate valve 127 to the vacuum pump 136.

Figure 2A:
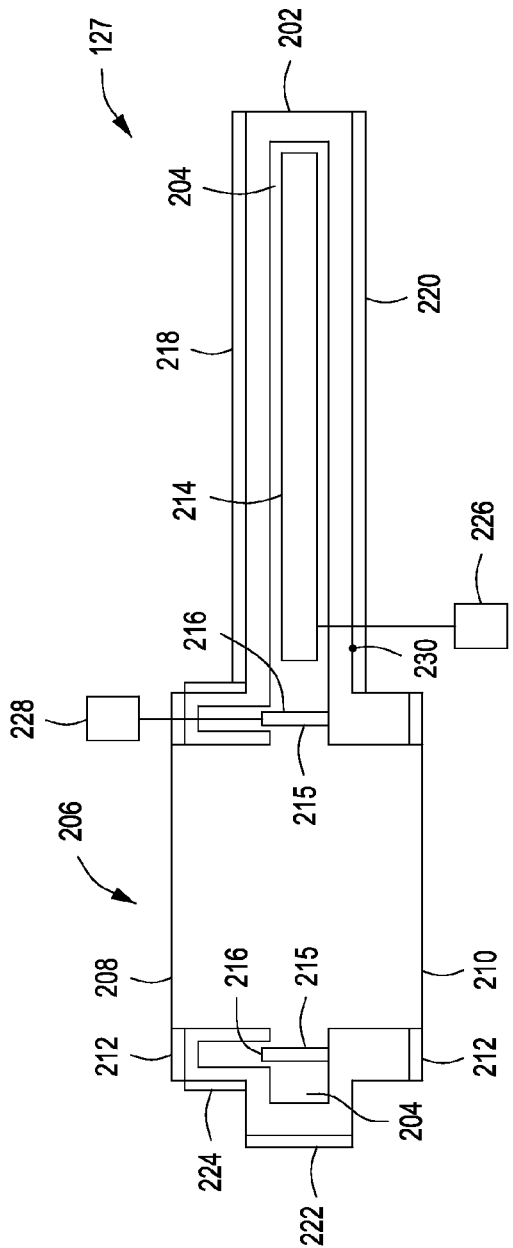
FIG. 2A depicts a schematic side view of the gate valve of FIG. 1 in an open position in accordance with some embodiments of the present invention.
Figure 2B:
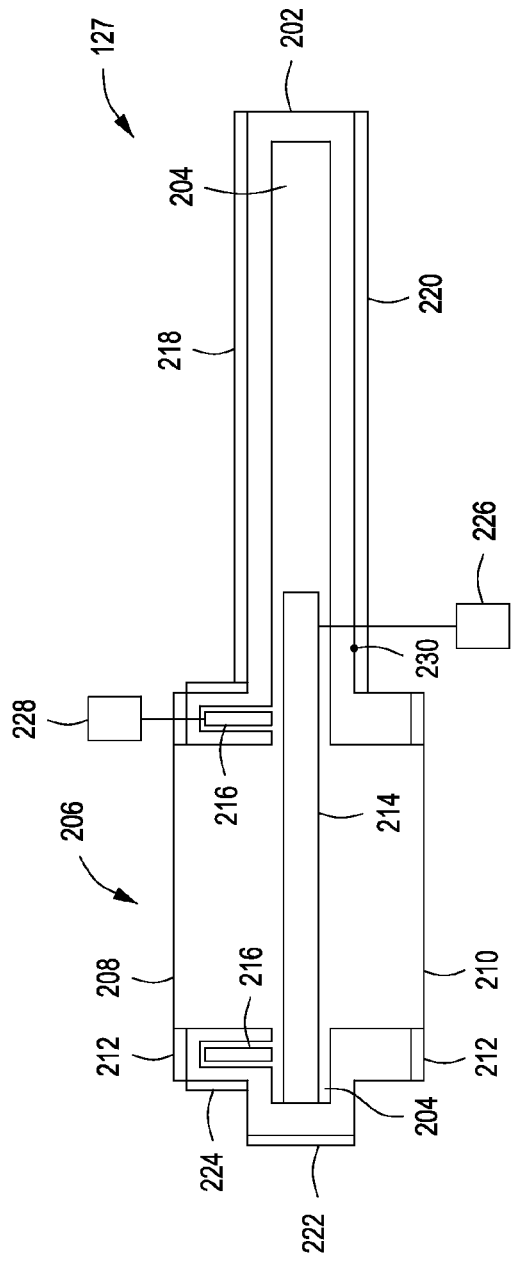
FIG. 2B depicts a schematic side view of the gate valve of FIG. 1 in a closed position in accordance with some embodiments of the present invention.

The gate valve 127 may be configured to prevent the deposition of the gaseous mixture 150, the plasma 155, gaseous byproducts, polymeric species or combinations thereof on and/or within components of the gate valve 127. FIGS. 2A-B depict the gate valve 127 in further detail, and illustrate the gate valve 127 in both the open (FIG. 2A) and closed (FIG. 2B) position.

FIG. 2A depicts a schematic side view of the gate valve 127 in accordance with some embodiments of the present invention. The gate valve 127 includes a body 202 having a valve opening 206 disposed through the body 202 (for example, from a first surface 208 of the body 202 to an opposing second surface 210 of the body 202). The body 202 may have any suitable shape as required for a particular application. In some embodiments, the body 202 may have a substantially oval shape as illustrated in FIG. 2A. The body 202 may have any other suitable shape appropriate for coupling the gate valve 127 to the chamber 110, or other chamber, as appropriate. The gate valve 127 may further include one or more flanges 212 disposed near the first surface 208 and the second surface 210 of the body 202 proximate the opening 206. The flanges 212, for example, may be part of the body 202, or may be welded, bolted, or otherwise affixed to the body 202. The flanges 212 may be utilized to couple the gate valve 127 to the process chamber 110 (on one side of the opening 206) and the vacuum pump 136 (on the other side of the opening 206). The body 202 may be fabricated from one or more process-compatible materials, including non-limiting examples such as stainless steel or aluminum.

A pocket 204 extends from a sidewall of the opening 206 and into the body 202. A gate 214 may be movably disposed within the body 202 of the gate valve 127 between two positions—within the pocket 204 and within the opening 206. For example, when the gate valve 127 is in an open position (FIG. 2A), the gate 214 is disposed completely within the pocket 204 and does not extend into the opening 206. When the gate valve 127 is in a closed position (FIG. 2B), the gate 214 is disposed within the opening 206 and substantially seals the opening 206, for example, preventing the flow of gases, plasma, byproducts, or the like between the inner volume 111 of the chamber 110 and the vacuum pump 136. The gate 214 may be any suitable shape, for example circular, that allows the gate 214 to seal the opening 206 when the gate valve 127 is in the closed position. The gate may comprise one or more suitable process-compatible materials including non-limiting examples such as stainless steel or aluminum. The gate 214 may be moved via an actuator 230, such as a linear or rotary actuator that may be coupled to the gate 214, directly, or via some other component (such as a shaft) to control the position of the gate 214 via operation of the actuator 230.

The gate valve 127 further includes a shutter 216 configured to selectively seal the pocket 204 when the gate valve 127 is in the open position (FIG. 2A). The shutter 216 may be any suitable shape necessary to the seal the pocket 204. For example, the shutter 216 may be an annular cylinder or similar shape that generally conforms to the shape of the opening 206. The shutter 216 may comprise one or more suitable process-compatible materials including non-limiting examples such as stainless steel or aluminum.

In some embodiments, the shutter 216 may be disposed within a recess formed within the body 202 proximate the opening 206. The shutter 216 may be movable between a first position (FIG. 2A) that seals the pocket 204 and a second position (FIG. 2B) that reveals the pocket 204 and allows the gate 214 to freely move without interference from the shutter 216. Accordingly, the shutter 216 can prevent gases, plasma, byproducts or the like from depositing on the gate 214 and within the pocket 204 of the gate valve 127 when in the first (or closed) position.

The shutter 216 may be coupled to an actuator 228 that facilitates movement (e.g., extension and retraction) of the shutter 216. Exemplary devices can include pneumatic or hydraulic actuators, or the like. In some embodiments, the actuator 228 is a pneumatic actuator.

In some embodiments, one or more heaters may be coupled to the gate valve 127. The one or more heaters may comprise resistive heating elements, or other suitable heating devices. The one or more heaters may be disposed in a configuration about the body 202 that facilitates maintaining the gate valve 127 at a temperature of between about 85 to about 95 degrees Celsius. In some embodiments, the one or more heaters may be configured to facilitate maintaining a surface 215 of the shutter 216 that faces the opening 206 at a temperature between about 85 to about 95 degrees Celsius. The one or more heaters may be configured to prevent deposition and/or condensation of the gases or the like on components of the gate valve 127, such as the opening facing surface 215 of the shutter 216, by maintaining such surfaces at temperatures above the condensation point of the process gases utilized in a given process.

The one or more heaters may be disposed at one or more locations on the body 202 of the gate valve 127. For example, a heater 218 may be disposed on the first surface 208 of the body 202. A heater 220 may be disposed on the second surface 210 of the body 202. A heater 222 may be disposed on a portion of a side of the body 202, or about the body 202 (not shown). A heater 224 may be disposed proximate the opening 206, for example, about the flange 212 as shown or on the upper or lower surfaces proximate the opening 206 (not shown). The configuration of the one or more heaters as depicted in FIGS. 2A-B is merely exemplary, and other configurations are possible, such as any suitable configuration for maintaining the temperature range discussed above and/or preventing deposition of gases or the like on components of the gate valve.

Further, the one or more heaters may be detachable from the gate valve 127. The detachability of the one or more heaters can facilitate ease of cleaning, removal, replacement, and/or reconfiguration for optimization of temperature profile on components of the gate valve 127, such as the surface 215 of the shutter 216 facing the opening 206 (and thereby exposed to process effluent flowing through the opening 206 of the gate valve 127).

One or more temperature sensors 226 may be coupled to components of the gate valve 127, such as the body 202 and/or the shutter 216, to monitor the temperature thereof. Exemplary sensors may include those utilized to monitor temperature via electrical feedback. One exemplary sensor that may be utilized with the gate valve 127 of the present invention is a resistance temperature detector (RTD) sensor. The one or more sensors may be configured to monitor temperatures between about −40 to about 120 degrees Celsius. The one or more sensors 226 may be part of a feedback loop which functions to maintain the temperature of the components within a range as discussed above. For example, should the temperature of a component exceed the specified range, the one or more sensors may send a signal that facilitates reducing power supplied to the one or more heaters. Monitoring the temperature of components of the gate valve reduces the likelihood that such components may deform or warp due to exceeding a specified temperature limit.

The one or more sensors 226, the one or more heaters, the opening and closing of the gate 214, and the extending and retracting of the shutter 216 may be controlled by a controller, such as the controller 140 of the process chamber 110 (discussed below). Alternatively, a separate controller (not shown) may be utilized to control the operation of the gate valve.

Returning to FIG. 1, the temperature of the substrate 114 is controlled by stabilizing a temperature of the substrate support 116. In one embodiment, the helium gas from a gas source 148 is provided via a gas conduit 149 to channels (not shown) formed in the pedestal surface under the substrate 114. The helium gas is used to facilitate heat transfer between the substrate support 116 and the substrate 114. During processing, the substrate support 116 may be heated by a resistive heater (not shown) within the pedestal to a steady state temperature and then the helium gas facilitates uniform heating of the substrate 114. Using such thermal control, the substrate 114 may be maintained at a temperature of between about 0-350 degrees Celsius. Typically, the wall 130 is coupled to an electrical ground 134. The temperature of the wall 130 is controlled using liquid-containing conduits (not shown) that run through the wall 130.

To facilitate control of the process chamber 110 as described above, the controller 140 may be one of any form of general-purpose computer processor that can be used in an industrial setting for controlling various chambers and sub-processors. The memory 142, or computer-readable medium, of the CPU 144 may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. The inventive method described below is generally stored in the memory 142 as a software routine. The software routine may also be stored and/or executed by a second CPU (not shown) that is remotely located from the hardware being controlled by the CPU 144.

Figure 3:
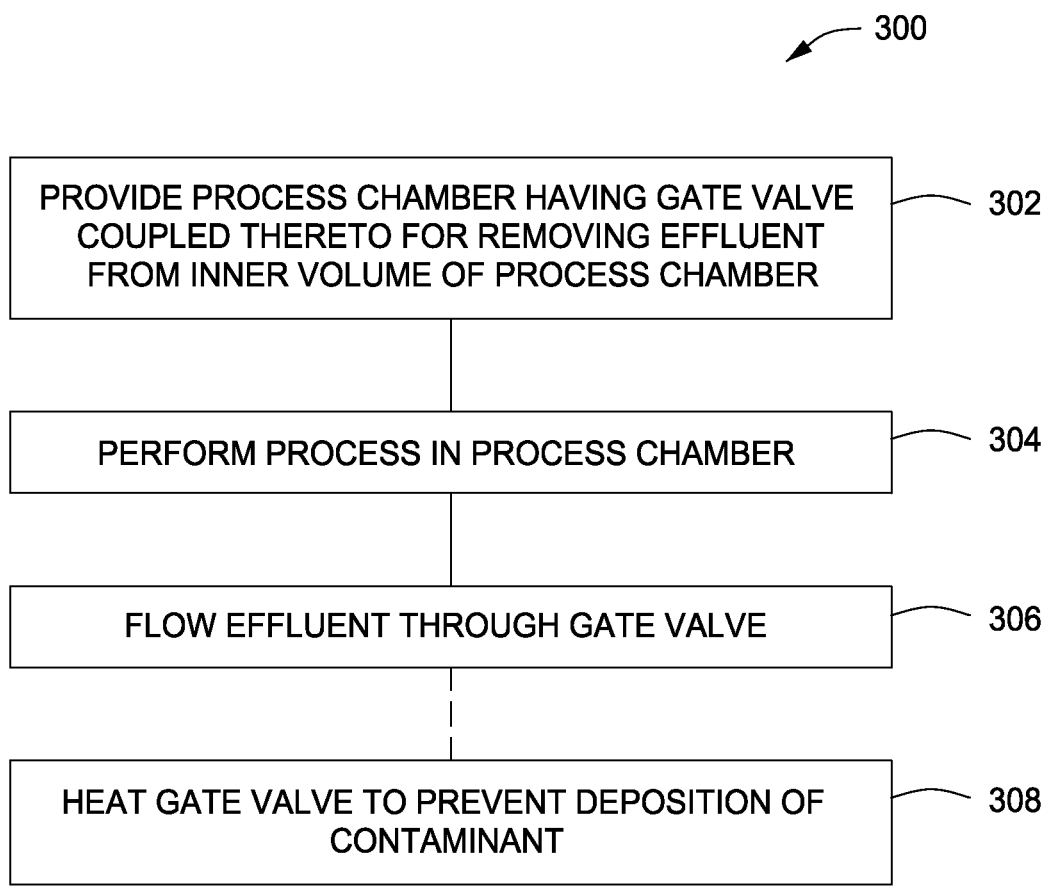
FIG. 3 depicts a flow chart for a method of removing an effluent from a process environment in accordance with some embodiments of the present invention.

FIG. 3 depicts a flow chart for a method of removing effluent from a process environment in accordance with some embodiments of the present invention. The method 300 is described below with respect to FIGS. 1 and 2A-B. The method may advantageously restrict or prevent contaminant formation and subsequent migration into the process chamber.

The method 300 begins at 302 by providing a process chamber 110 having a gate valve, such as the gate valve 127, coupled thereto for removing effluent from the inner volume 111 of the process chamber 110. The gate valve may be provided in an open position, such that the process environment (e.g., inner volume 111) is fluidly coupled to the vacuum pump 136. As discussed above, in the open position, the gate 214 is disposed in the pocket 204 of the body 202, and the gate 214 and the pocket 204 of the body 202 are sealed from the opening 206 by the shutter 216 (as depicted in FIG. 2A).

At 304, a process may be performed, for example, in the exemplary etch reactor 100, that generates an effluent to be removed from the inner volume 111. The process may include a plasma etch process, however, other processes that may benefit from the present invention may include any process that may undesirably result in effluent that may deposit on and/or within components of the gate valve. Such processes may include chemical vapor deposition, or the like.

In some embodiments, the process is a plasma etch process that utilizes a plasma (e.g., plasma 155) formed from a process gas (e.g., gaseous mixture 150). The process gas may include a polymer-forming component, such as, but not limited to, fluorocarbons, hydrofluorocarbons, and the like. In some embodiments, for example to etch aluminum, the process gas may include at least one of trifluoromethane ($CHF_3$), chlorine ($Cl_2$), or a fluorocarbon ($C_xF_y$). The plasma etch process may be utilized to etch, for example, a substrate, such as the substrate 114 disposed substrate support 116. In some embodiments, the substrate is an aluminum-containing substrate. Other process gases may also be utilized for the same or for other processes.

At 306, the effluent may be flowed from the inner volume 111 through the opening 206 in the gate valve 127 and out of the reactor 100 via the vacuum pump 136. The effluent may include at least one of a byproduct, a reactive species, or the process gas. The byproduct, for example, may comprise a combination of material from the substrate and the process gas or the plasma. The reactive species may include, for example, ions or radials such as those resulting from plasma formation, and further, polymeric species formed from polymerization of radicals. The process gas may include those process gases discussed above, or any process gas uses in the process and not consumed by the plasma.

In some embodiments, at 308, the gate valve may be heated to prevent deposition of a contaminant on the gate valve, for example on the opening facing surface 215 of the shutter 216. For example, polymeric species discussed above, or other such species may deposit and/or condense on components of the gate valve 127 at low temperatures and/or in a high pressure process environment. The heating may be facilitated by the one or more heaters, and may maintain the temperature of gate valve components, such as the shutter 216 at a temperature between about 85 to about 95 degrees Celsius. In some embodiments, the gate valve 127 is pre-heated prior to performing the process, and/or maintained in the temperature range during the process. Alternatively, or in combination with heating the gate valve, the process environment may be maintained at low pressure to limit condensation of contaminants. Low pressure, for example, may be maintained by lowering flow rates of the process gas, and adjusting settings on the vacuum pump 136. In some embodiments, the pressure of the process environment may be maintained at about 100 mtorr.

Thus, embodiments of improved gate valves and methods of using the same have been provided herein. The inventive gate valves and methods of using may advantageously prevent or restrict process gases, byproducts, or other such species generated during processing from depositing within a pocket of the gate valve or other components thereof. The inventive method may further advantageously prevent contaminants from entering the process environment due to deposition and subsequent flaking of contaminants on gate valve components.

While the foregoing is directed to embodiments of the present invention, other and further embodiments of the invention may be devised without departing from the basic scope thereof, and the scope thereof is determined by the claims that follow.

The invention claimed is:

1. A gate valve for use in a process chamber, comprising:
a body having an opening disposed therethrough from a first surface to an opposing second surface of the body;
a pocket extending into the body from a sidewall of the opening;
a gate movably disposed within the pocket between a closed position that seals the opening and an open position that reveals the opening and disposes the gate completely within the pocket;
a recess formed in the body about the opening; and
a shutter movable between a first position within the recess that allows the gate to freely move, and wherein the shutter is separated from the opening by a portion of the recess, and a second position that seals the pocket when the gate is in the open position.

2. The gate valve of claim 1, further comprising:
an actuator coupled to the shutter to move the shutter.

3. The gate valve of claim 2, wherein the actuator comprises a pneumatic actuator.

4. The gate valve of claim 1, wherein the body, shutter, and gate valve are formed from one or more of aluminum or stainless steel.

5. The gate valve of claim 1, wherein the shutter is an annular cylinder.

6. The gate valve of claim 1, further comprising:
one or more heaters coupled to at least one of the body or shutter.

7. The gate valve of claim 6, wherein the one or more heaters are disposed on the first and second surfaces of the body.

8. The gate valve of claim 7, wherein the one or more heaters are disposed on a side surface of the body disposed between the first and second surfaces.

9. The gate valve of claim 6, wherein the one or more heaters maintain a surface of the shutter that faces the opening at a temperature between about 85 to about 95 degrees Celsius when the gate valve is in the open position.

10. The gate valve of claim 6, wherein the one or more heaters are detachable.

11. The gate valve of claim 6, further comprising:
one or more temperature sensors coupled to at least one of the body or shutter.

12. The gate valve of claim 11, wherein the one or more temperature sensors detect temperature of at least one of the body or shutter.

13. The gate valve of claim 12, wherein the one or more sensors are capable of detecting temperature ranging from about −40 to about 120 degrees Celsius.

14. An apparatus for processing a substrate, comprising:
a process chamber having an inner volume for holding a substrate therein during processing; and
a gate valve coupled to the process chamber, wherein the gate valve comprises:
a body having an opening disposed therethrough from a first surface to an opposing second surface of the body;
a pocket extending into the body from a sidewall of the opening;
a gate movably disposed within the pocket between a closed position that seals the opening and an open position that reveals the opening and disposes the gate completely within the pocket;
a recess formed in the body and about the opening; and
a shutter movable between a first position within the recess that allows the gate to freely move, and wherein the shutter is separated from the opening by a portion of the recess, and a second position that seals the pocket when the gate is in the open position.

15. The apparatus of claim 14, wherein the process chamber is configured for plasma etching of a substrate.

16. The apparatus of claim 14, the gate valve further comprising:
one or more heaters coupled to at least one of the body or the shutter.

17. The apparatus of claim 16, the gate valve further comprising:
one or more sensors coupled to at least one of the body or the shutter to monitor the temperature of at least one of the body or shutter.

18. A method of removing an effluent from a process environment, comprising:
providing a process chamber having a gate valve coupled thereto for exhausting materials from an inner volume of the process chamber, the gate valve comprising a body having an opening disposed therethrough and a pocket extending into the body from a sidewall of the opening, a gate movably disposed in the pocket and the opening, wherein the gate is disposed completely within the pocket when the gate valve is in the open position, a recess formed in the body and about the opening, and a shutter movable between a first position within the recess that allows the gate to freely move, and wherein the shutter is separated from the opening by a portion of the recess, and a second position that seals the pocket when the gate is in the open position;

performing a process in the process chamber that generates an effluent to be removed from the inner volume; and flowing the effluent from the inner volume through the opening with the gate valve in the open position to remove the contaminant from the process environment.

19. The method of claim 18, further comprising:
heating the gate valve to prevent deposition of a contaminant on exposed surfaces of the gate valve.

20. The method of claim 19, wherein heating the gate valve further comprises:
heating a surface of the shutter facing the opening to a temperature between about 85 to about 95 degrees Celsius.

21. The method of claim 18, wherein the process further comprises:
a plasma etching process, wherein the plasma etching process utilizes a plasma formed from a process gas.

22. The method of claim 21, wherein the effluent further comprise at least one of a byproduct, a reactive species, or the process gas.

23. The method of claim 21, wherein the plasma etching process further comprises:
etching an aluminum-containing substrate.

24. The method of claim 21, wherein the process gas comprises at least one of trifluoromethane ($CHF_3$), chlorine ($Cl_2$), or a fluorocarbon ($C_xF_y$).

\* \* \* \* \*